United States Patent [19]

Renz et al.

[11] Patent Number: 5,473,252
[45] Date of Patent: Dec. 5, 1995

[54] HIGH-FREQUENCY APPARATUS FOR NUCLEAR SPIN TOMOGRAPHY

[75] Inventors: Wolfgang Renz; Markus Vester, both of Erlangen, Germany

[73] Assignee: Siemens Aktiengesellschaft, München, Germany

[21] Appl. No.: 248,992

[22] Filed: May 25, 1994

[30] Foreign Application Priority Data

Jul. 5, 1993 [DE] Germany .................. 43 22 352.4

[51] Int. Cl.⁶ .................................................. G01R 33/28
[52] U.S. Cl. .................................. 324/318; 324/322
[58] Field of Search .............................. 324/322, 318, 324/314, 300; 128/653.5

[56] References Cited

U.S. PATENT DOCUMENTS

| | | | |
|---|---|---|---|
| 4,638,253 | 1/1987 | Jaskolski et al. | 324/322 |
| 5,041,790 | 8/1991 | Tropp et al. | 324/318 |
| 5,243,289 | 9/1993 | Blum et al. | 324/322 |
| 5,245,288 | 9/1993 | Leussler | 324/318 |
| 5,302,901 | 4/1994 | Snelten | 324/318 |
| 5,365,173 | 11/1994 | Zou et al. | 324/318 |
| 5,416,414 | 5/1995 | Mansfield et al. | 324/318 |

FOREIGN PATENT DOCUMENTS

| | | |
|---|---|---|
| 0073375 | 12/1986 | European Pat. Off. . |
| 3500456 | 7/1985 | Germany . |
| 3816831 | 11/1989 | Germany . |
| 4113120 | 9/1993 | Germany . |

OTHER PUBLICATIONS ntz Archiv, vol. 11, No. 5 (1989), pp. 237–243, Wilhelm Dürr et al.: *Hochfrequenzsysteme für die Kernspintomografie* (High Frequency System for Nuclear Spin Tomography).

Magnetic Resonance in Medicine, vol. 4 (1987) pp. 179–184, James S. Hyde et al.: *Quadrature Detection Surface Coil.*

Primary Examiner—Sandra L. O'Shea
Assistant Examiner—Raymond Y. Mah
Attorney, Agent, or Firm—Kenyon & Kenyon

[57] ABSTRACT

A high-frequency apparatus for nuclear spin tomography includes a high-frequency transmitter for exciting nuclear spin in a body to be imaged and a high-frequency receiver for detecting B-field components resulting from the nuclear spin. The high-frequency receiver includes a galvanically-separated local coil device having two antenna loops between which an amplifier unit is connected. The local coil device radiates new B-field components in response to the original B-field components caused by the nuclear spin excitation, with the new B-field components oriented substantially orthogonal to the original B-field components. The new B-field components are then received by an external receiving antenna for subsequent signal processing, ultimately resulting in an image of the body.

20 Claims, 4 Drawing Sheets

HIGH-FREQUENCY APPARATUS FOR NUCLEAR SPIN TOMOGRAPHY

BACKGROUND OF THE INVENTION

The invention relates to the field of magnetic nuclear resonance, and in particular to an improved apparatus for nuclear spin tomography wherein a high-frequency transmitter is decoupled from a high-frequency receiver using a cableless local coil device.

Devices for generating images of an object to be investigated using magnetic nuclear resonance are well-known. Such devices are commonly used to generate images of a human body or part thereof to assist in diagnosis of various physical ailments. In a typical prior art device, a body to be imaged is placed in a powerful homogenous magnetic field, referred to as the "basic field," which aligns the nuclear spin of atomic nuclei in the body. Such fields are particularly effective on hydrogen atom nuclei, or protons, bonded to water molecules. The nuclei are excited into a precessional movement by high-frequency exciting pulses. At the end of such an exciting pulse, the atomic nuclei precess with a frequency that depends on the strength of the basic field. Then, after a predetermined relaxation period, the spin of the nuclei cause them to oscillate back in the preferred direction determined by the basic field.

Using a computer and/or other measurement technology to analyze the integral high-frequency nuclear signals, an image of a layer of the body can be generated from the three-dimensional spin density or the distribution of the relaxation times. Linear field gradients may be used to allocate the nuclear resonance signal detectable as a consequence of the precessional movement at the point that it occurs. The quality of the image may be enhanced by superimposing suitable gradients on the basic field and controlling them so that excitation of the nuclei is confined to a single layer of the body to be imaged. Imaging based on these physical effects is known generally as nuclear spin (NS) or nuclear magnetic resonance (NMR) tomography.

A high-frequency device for nuclear spin tomography is described in German patent DE-OS 35 00 456. A high-frequency transmitter is used to excite nuclear spin in a body to be investigated. A high-frequency receiver is then used to detect high-frequency B-field components produced by the nuclear spin excitation. The receiver includes a local coil device which is electrically-insulated from the other components of the receiver for placement on the body to be imaged. The receiver also includes an external receiving antenna surrounding the local coil device and coupled inductively therewith.

In known high-frequency devices of the type to which the present invention is directed, two different high-frequency components are required to create an image; namely, a high-frequency transmitter and a high-frequency receiver. A high-frequency receiver with a local coil device is often used for such applications, especially where body areas of relatively limited extent are to be imaged. Such a local coil device typically has a surface or local coil which is placed on the part of the body to be imaged, such as a vertebra, the middle ear, or an eye. In the simplest implementation, the local coil consists of a circular antenna loop made of wire. A capacitor is used to bridge a break in at least one point, and the device is switched by high-frequency signals. Such a local coil device may be used to pick up the high-frequency signals generated by the nuclear spin excitation as a corresponding B-field.

Devices employing high-frequency excitation of nuclear spin require a transmitter with at least one antenna to produce the excitation. A suitable high-frequency transmitter antenna may be designed as a "whole-body resonator," as described in Wilhelm Dürr et al., *High Frequency System for Nuclear Spin Tomography*, ntz Archiv, Vol. 11, No. 5, at 237–243 (1989) and in European publication EP-B-0 073 375. Such an antenna is formed as a round hollow-conductor antenna which surrounds the body to be imaged.

In known high-frequency nuclear spin tomography systems, the high-frequency signals resulting from the nuclear spin excitation are typically conducted through a feed or connecting cable running from the investigation area out to signal-processing equipment. In such devices, the feed cable itself can degrade system performance by inhibiting transmission of the high-frequency signals. Moreover, disturbances in the form of sheath waves may form on the feed cable, which can result in an undesirably high power density in the area of the body being imaged. One solution to these drawbacks of cable-based devices has been to electrically insulate the local coil device from the other components of the receiver.

In the high-frequency receiver described in German patent DE-OS-35 00 456, described above, a certain component of the B-field emitted by the body being imaged is picked up by a local coil device having at least one antenna loop, thereby generating a current in the local coil device. The associated B-field is then detected by a corresponding receiving antenna surrounding the body being imaged, and thus surrounding the local coil device as well. A resulting signal induced in the outer antenna is fed by known methods to electronics coupled to the outer antenna for further processing.

A principle drawback of such inductively-coupled devices lies in the fact that the measurement signal is weakened by the inductive coupling between the local coil device and the outer receiving antenna. The noise component of the signal produced by the outer receiving antenna as the signal is fed to the electronic signal processing equipment is thus undesirably high. This problem, manifested as a low signal-to-noise (S/N) ratio, is especially critical when either the field-sensitive components of the local coil device are relatively small or the outer receiving antenna exhibits a relatively poor Q-factor.

SUMMARY OF THE INVENTION

The present invention is directed to an improved high-frequency, tomography system that solves the problem of signal-to-noise ratio deterioration commonly occurring in known systems, thereby enhancing image quality by ensuring undisturbed operation of the electronics used to process an imaging signal. This goal is achieved by providing a local coil device of a high-frequency receiver having at least two antenna loops with an amplifier unit connected between them. With such a configuration, new B-field components to be detected by an external receiving antenna are generated by the local coil device in response to B-field components generated by the nuclear spin excitation of a body being imaged. These new B-field components are oriented substantially orthogonal to the original B-field components.

A high-frequency apparatus for nuclear spin tomography according to the present invention offers several unique advantages over prior art systems. For example, the signal from the local coil device to be transmitted by induction to the outer receiving antenna is sufficiently amplified so that the noise component is minimized. Moreover, the undesirable tendency of the amplifier unit to oscillate is suppressed. This problem is especially prevalent in applications using an amplifier unit with a relatively high amplification factor, because coupling of the input and output of the amplifier unit may be influenced by the body being imaged, causing an undesirable tendency to oscillate. To further avoid this effect, the present invention employs two decoupled signal paths; namely, one for signal transmission from the body being imaged to the local coil device, and the other for transmission of the amplified signals from the local coil device to the external receiving antenna.

Decoupling of the two signal paths is achieved because only B-field components that are orthogonal to one another are transmitted along the respective signal paths. The local coil device must have at least two antenna loops to accomplish the desired decoupling. Accordingly, there are two theoretical possibilities for the selection of B-field components. First, the two antenna loops may be arranged orthogonally to one another so that only a predetermined B-field component is detected with the first antenna loop, while a different B-field component orthogonal to the other is generated by the second antenna loop. Alternatively, only one predetermined B-field component is detected by the two antenna loops. In this case, use of the amplifier unit requires that a B-field component be emitted orthogonally to the amplifier by the two antenna loops.

Features and advantages of the present invention are described below with reference to the drawing figures and the preferred embodiments. Other features and advantages will be readily apparent to persons skilled in the art.

DETAILED DESCRIPTION

Figure 1:
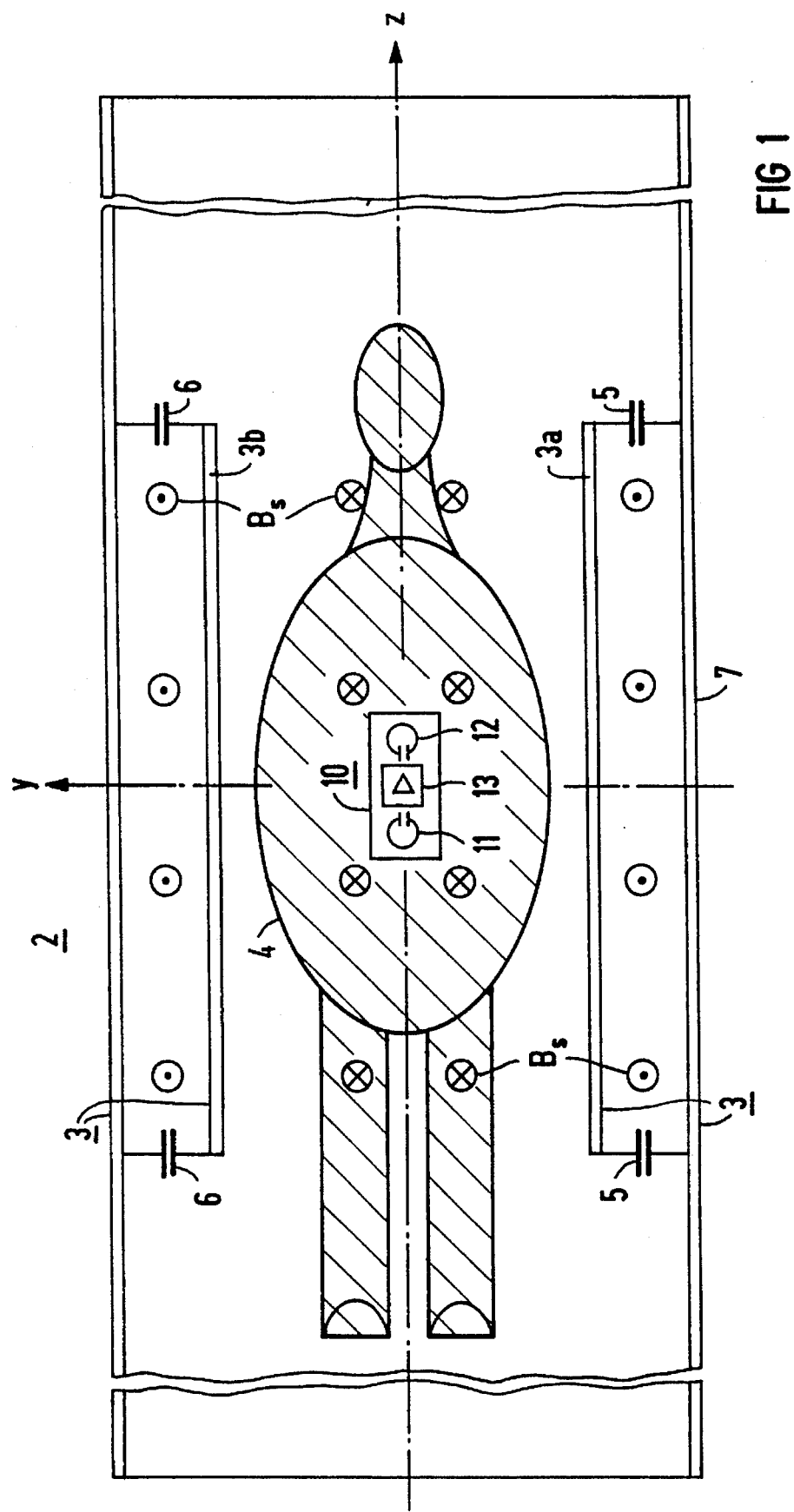
FIG. 1 is a schematic of an embodiment of a high-frequency device for nuclear spin tomography according to the present invention.

Referring now to FIG. 1, an embodiment of a high-frequency device 2 for nuclear spin tomography may be located, for example, in a basic field magnet formed as a hollow cylinder (not shown) whose axis runs in the z-direction of a rectangular (x-y-z) coordinate system. The high-frequency device 2 includes a high-frequency transmitter having a transmitting antenna 3 formed, for example, as a whole-body resonator and capable of exciting nuclear spin in a body 4 or part thereof. The body 4, indicated schematically as a shaded area, is located within the space surrounded by the transmitting antenna 3.

The transmitting antenna 3 of the present embodiment is linearly-polarized, having two antenna leads 3a, 3b extending in the direction of the z-axis. The antenna leads 3a, 3b are coupled to a hollow cylindrical high-frequency shield 7 by resonance capacitors 5, 6. The high-frequency shield 7, disposed concentrically around the z-axis, may be composed of copper foil or other suitable material to ensure the shield 7 is permeable to low-frequency gradient fields but practically impermeable to high-frequency fields. The shield 7 and the antenna leads 3a, 3b form a round, hollow conducting antenna whose coupling elements are the antenna leads 3a, 3b themselves. A pulsed magnetic field generated by this antenna during transmission is indicated by its induction $B_S$, whose location-dependent direction is illustrated by dots and crosses in FIG. 1.

The just-described features of the embodiment shown in FIG. 1 are generally known in the art. A whole-body resonator of this type is described in German patent DE-OS 41 13 120. While a whole-body resonator in the form of a round hollow conducting antenna is well-suited to the present invention, other known antenna configurations which similarly produce resonant oscillating circuits are equally suitable.

The high-frequency device 2 also includes a high-frequency receiver for detecting high-frequency signals generated by nuclear spin excitations in the body 4 and relaying those signals to an electronic signal-processing system. In this embodiment, the receiver is designed for measurement in a relatively limited area of the body 4. The receiver includes a local coil device 10 having at least two antenna loops 11, 12, and an amplifier unit 13. The local coil device 10 may be located on the body 4, or rather in the vicinity of a surface of the body 4, and is sensitive to a predetermined component of a high-frequency B-field (B1) that is associated with high-frequency signals that will be emitted from the body 4 upon nuclear spin excitation. Unlike prior art systems, the B1 component is not conducted by a connecting lead to external signal-processing equipment. Instead, the amplifier unit 13 generates a signal in the form of a second B-field component (B2) aligned orthogonal to the originally-detected B-field component (B1), which signal is transmitted by induction to a receiving antenna. The local coil device 10 may therefore be considered "cableless."

The antenna used to detect the B2 component should be located outside of both the area of the part of the body 4 being examined and the area of the local coil device 10. Thus, the antenna is preferably an external receiving antenna surrounding the local coil device 10. In the embodiment of FIG. 1, the transmitting antenna 3 simultaneously serves as an external receiving antenna 3'. Nonetheless, a discrete external receiving antenna may also be employed. Once the external receiving antenna 3' receives the detected high-frequency signal (B2), the signal is fed to signal-processing electronics using known methods.

Figure 2:
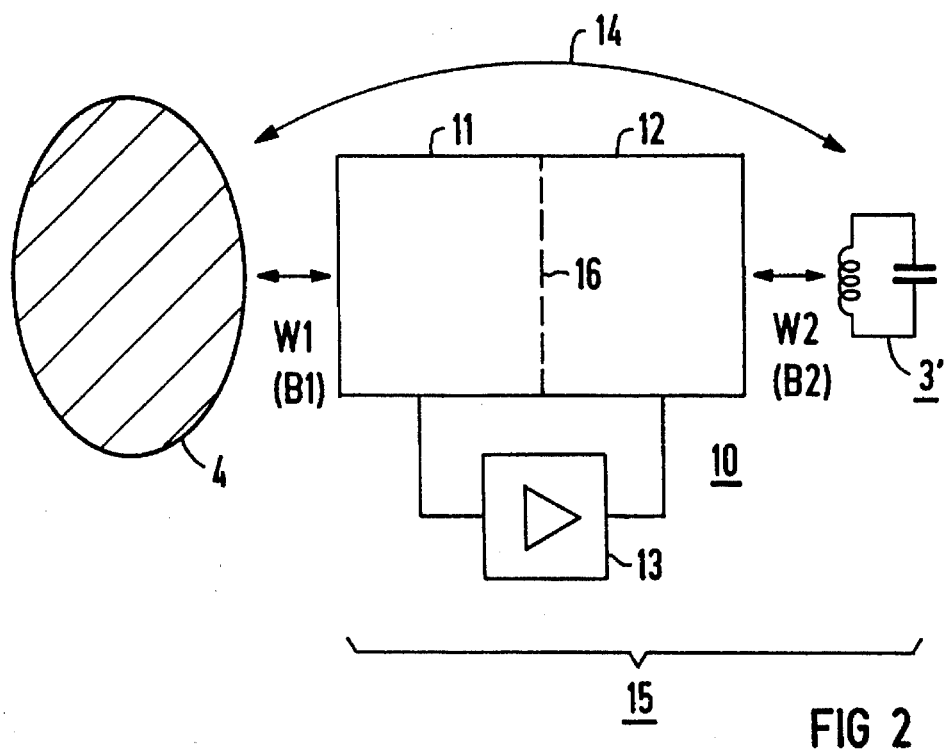
FIG. 2 shows the signal paths in the receiver of the embodiment shown in FIG. 1.

FIG. 2 shows the signal paths in an embodiment of a high-frequency receiver 15 according to the present invention. Two decoupled signal paths W1, W2 are provided. The first signal path W1 is used to transmit a signal from the body 4 being imaged to the local coil device 10; while the second signal path W2 is used to transmit a signal amplified by the amplifier unit 13 from the local coil device 10 to the receiving antenna 3'.

To illustrate the operation of the high-frequency receiver 15, assume a nuclear resonance signal B1 emanating from the body 4 is detected by the first antenna loop 11. The signal is then amplified in amplifier unit 13 and transmitted by the second antenna loop 12 as a second B-field component B2, aligned substantially orthogonal to B1, to the receiving antenna 3'. The amplifier unit 13 is thus a two port amplifier whose amplification is limited by the decoupling of the two transmission paths W1, W2. The dashed line 16 of the local coil device 10 signifies that with the two antenna loops 11, 12, it is possible to receive in the first coil mode as well as to transmit in the second coil mode. Direct coupling of the receiving antenna 3' to the tissue of the body 4 is signified by the doubled-headed arrow 14.

Figure 3:
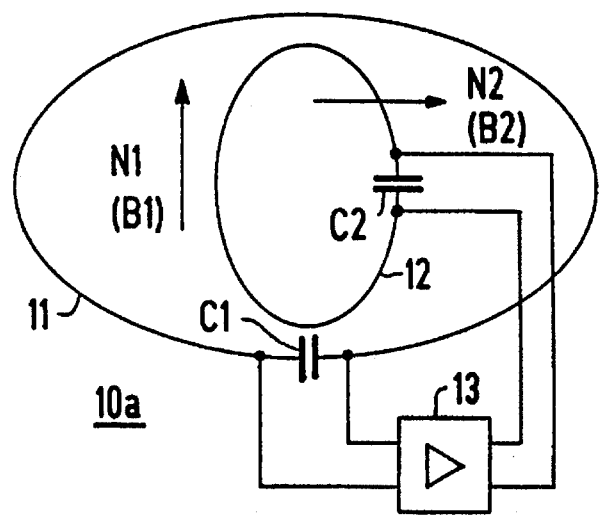
FIG. 3 shows a first embodiment of a local coil device for use with the high-frequency receiver of FIG. 2.

If the embodiment shown in FIG. 2 is assumed to be a high-frequency linearly-polarizing device, it would be advantageous for the first signal path W1 to carry a B-field component B1 that is perpendicular to the transmitting field $B_S$ (see FIG. 1) produced by the transmitting antenna 3. The second B-field component B2, whose orientation matches that of the transmitting antenna field $B_S$, then serves to connect the local coil device 10 to the receiving antenna 3'. FIG. 3 shows one possible arrangement of two antenna loops 11, 12 of a local coil device 10a which achieves this desired signal path arrangement.

In the local coil device 10a of FIG. 3, two antenna loops 11, 12 are arranged such that a normal N1 of a surface spanned by the first antenna loop 11 is perpendicular to a normal N2 of the surface spanned by the second antenna loop 12. As a result, the B-field components B1, B2 associated with the antenna loops 11, 12 also point in the respective directions of the normals N1, N2. In operation, a received signal is tapped from a resonance capacitor C1 in antenna loop 11 and fed to the amplifier unit 13. The amplified signal is then fed to a resonance capacitor C2 in antenna loop 12. The radiating antenna loop 12 desirably encompasses a smaller surface area than the receiving antenna loop 11, and each antenna loop may have at least one winding. In an alternative embodiment, each of the antenna loops 11, 12 may be replaced by a system of several antenna loops.

Figure 4:
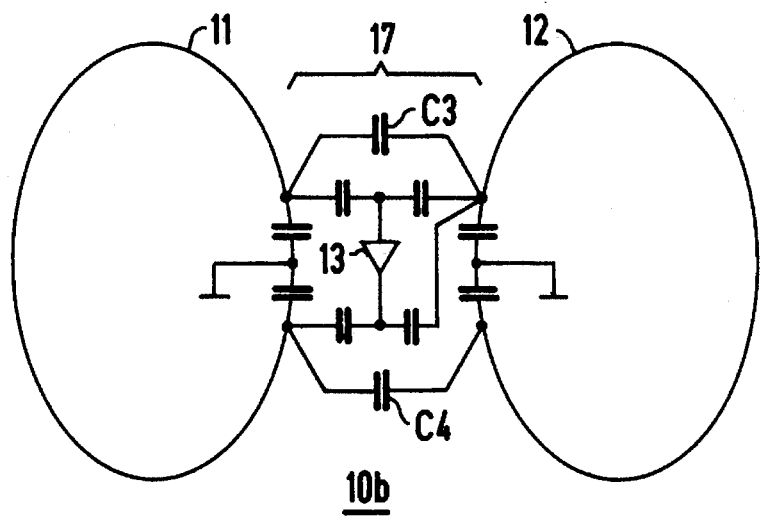
FIG. 4 shows a second embodiment of the local coil device for a first polarization condition.

FIG. 4 shows another embodiment of a local coil device 10b. This embodiment is a modified "butterfly type" double loop device, as described in James S. Hyde et al., *Quadrature Detection Surface Coil*, Magnetic Resonance in Medicine, Vol. 4, at 179–184 (1987). Unlike the embodiment shown in FIG. 3, here the two antenna loops 11, 12 lie in a common geometric plane. The amplifier unit 13 receives its input signal from the B-field component B1 disposed perpendicular to the surface occupied by the antenna loops 11, 12, so that currents oriented in the same direction are excited in each. The amplifier unit 13 then delivers its input signal into the B-field mode B2 disposed orthogonal to the B1 component. The B2 component then passes as a current through the two antenna loops 11, 12 in opposite directions. Capacitors C3, C4 provide compensation of loop coupling for identical resonance frequencies of the two oscillation modes. The network linking the two antenna loops 11, 12 and including the amplifier unit 13 is designated as reference numeral 17.

Care must be taken in the arrangement of certain components of linearly-polarizing high-frequency devices such as those just described. A cableless, linearly-polarizing local coil device included in a linearly-polarizing transmitter is subject to certain restrictions as to positioning with respect to a local coil device coupled through a connecting cable. For example, orthogonal B-field orientations of the transmitter and the transmitting system of the local coil device should be avoided to prevent undesired suppression of signal transmission.

In a circularly-polarizing high-frequency system e.g. only the right-rotating clockwise-rotating B-field component is received from the body being imaged. The received signal is amplified and then re-fed into the antenna loop to produce a left-rotating counterclockwise-rotating B-field component.

Like the earlier embodiments, the input and output of the amplifier unit are decoupled. A local coil device for a circularly-polarizing system may be based on either the perpendicular-plane antenna arrangement 10a shown in FIG. 3 or the common-plane antenna arrangement 10b shown in FIG. 4.

Figure 5:
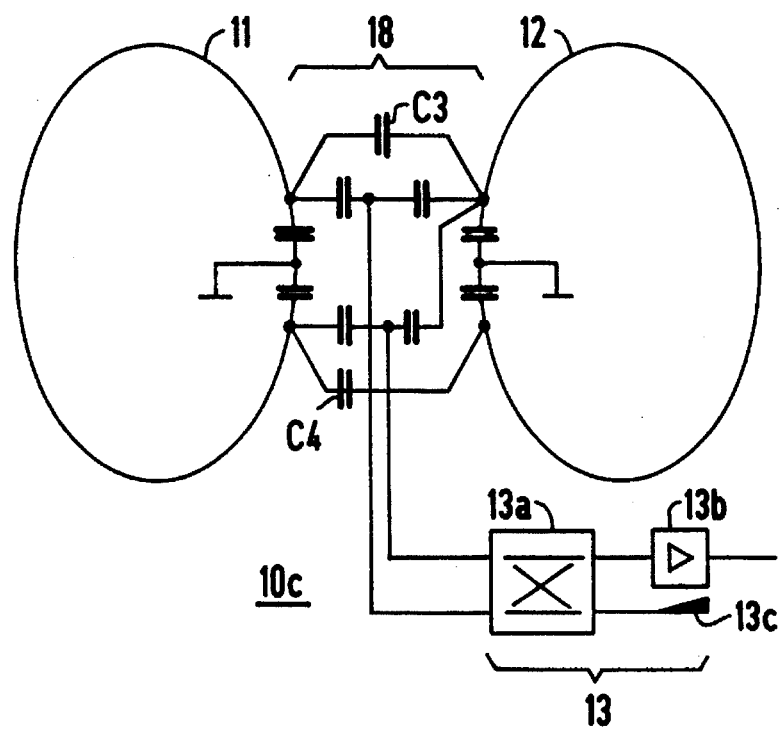
FIG. 5 shows the second embodiment of the local coil device for a second polarization condition.

FIG. 5 shows an embodiment of a local coil device 10c modeled off of the common-plane device of FIG. 4. Here, orthogonal B-field components with right-rotating circular reception are combined in a 90° hybrid circuit 13a of the amplifier unit 13 (designated a $\pi/2$ hybrid). The hybrid circuit 13a includes a terminating resistor 13c. In operation, a signal amplified by a reflecting amplifier 13b is fed to the hybrid circuit 13a. Two antenna loops 11, 12 then emit a left-rotating circular signal, forming a new B-field component, to the external receiving antenna. The network provided between the two antenna loops 11, 12, and to which the hybrid circuit 13a is coupled, is designated by reference numeral 18.

Figure 6:
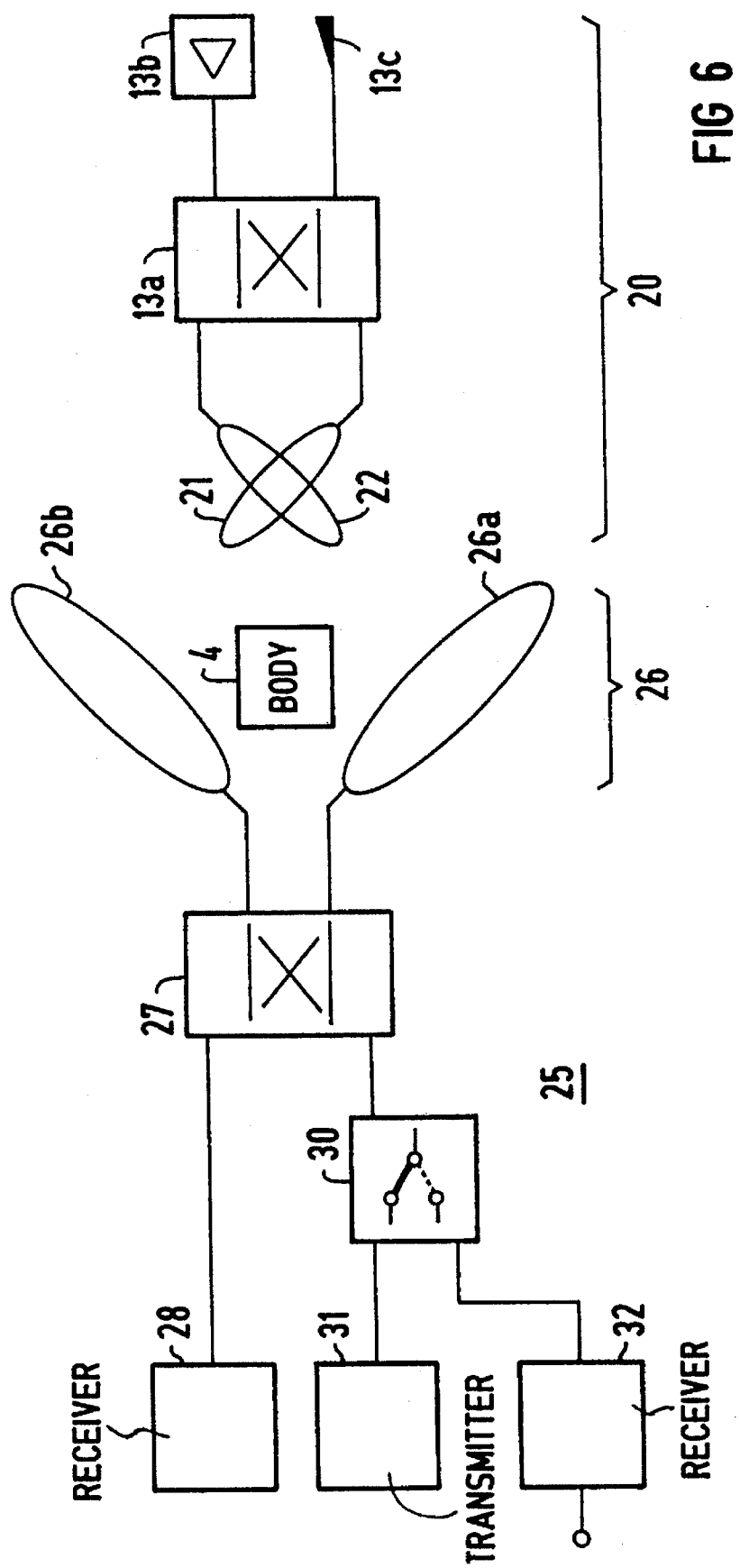
FIG. 6 is an equivalent circuit diagram of a high-frequency tomography system having circular polarization.

FIG. 6 is a circuit diagram for an embodiment of a circularly-polarizing transmitter wherein a left-rotating B-field component is passed on to the receiver. This embodiment includes a local coil device 20 with two antenna loops 21, 22, a first 90° hybrid circuit closed off by a terminating resistor 13e, and a reflecting amplifier 13b. A transmitting and receiving device 24 includes a whole-body resonator 26 with two partial antenna systems 26a, 26b connected to one another by a second 90° hybrid circuit 27. This second 90° hybrid circuit 27 is coupled by one of its terminals to a receiver 28 used during normal operation (that is, without the local coil device 20). A second terminal of the 90° hybrid circuit 27 is coupled to a transmit/receiver switch 30. During transmission operations, this switch 30 connects a transmitter 31 to the hybrid circuit 27; while during receiving operations using local coil device 20, the switch 30 connects a receiver 32 to the hybrid circuit 27.

As discussed above, in a high-frequency device employing a linearly-polarizing transmitting antenna and a linearly-polarizing local coil device, the present invention ensures the alecoupling of the input and output of an amplifier unit connected between two antenna loops. The same conditions prevail with a circularly-polarizing transmitting antenna and a circularly-polarizing local coil device with rotational directions of the B-fields in opposite directions for the input and output of the amplifier unit. Thus, in a high-frequency device according to the present invention, the same polarizing conditions are advantageously provided by both the high-frequency transmitter and the high-frequency receiver.

In addition to the components described with reference to FIGS. 1–5, a local coil device of a high-frequency nuclear spin tomograph must have a power supply for its amplifier unit, which generally consists of a preamplifier and possibly additional electronics required for operation. A dual-gate MOSFET (metal oxide semiconductor-field effect transistor) may be used for this purpose, requiring approximately 10 mA at a 10–15 V operating voltage for an optimum noise figure however, a power supply consisting of unmagnetic lithium batteries or lead batteries is generally sufficient because the power supply need only be activated for a few seconds following the transmitting pulses of the transmitter.

The antenna loops of a local coil device according to the present invention must be detuned during transmission. One method by which the required tuning may be achieved employs a passive detuning circuit in which, using two anti-parallel switching diodes at high receiving levels of the respective conductor loop, an inductance of like size is connected in parallel, thereby increasing the resonance frequency. At the same time, the response of the detuning circuit can be detected, thus permitting the power supply of the amplifier unit to be switched on for a predetermined period of time so that the receiving operation may begin after a transmitting pulse ends.

In a system where the transmitting antenna simultaneously serves as receiving antenna, several adjustments may be required to accommodate the cableless local coil device. For example, a linearly-polarizing transmitter would have an additional matching transformer provided at the receiver input because the local coil device, as a result of its tuning requirements, loads the transmitter differently during transmission and reception. Such a matching transformer may be tuned similarly to those in known local coil devices using a cable connection by transmitting a low-level input from the receiver input to the antenna, whereby a detune circuit of the local coil device must not respond.

Referring again to the embodiment of FIG. 6, when the two partial antenna systems 26a, 26b of a circularly-polarizing transmitter are separated, it is possible to use a partial system consisting of the transmitter along with a linearly-polarizing local coil device for receiving, while using the other partial systems for transmission. In such an arrangement, an additional matching transformer is not necessary.

While the present invention has been described with reference to specific embodiments, it will be apparent to persons skilled in the art that many modifications and variations are possible. Accordingly, the present invention embraces all alternatives, modifications and variations that fall within the spirit and scope of the appended claims, as well as all equivalents thereof.

What is claimed:

1. A high-frequency apparatus for nuclear spin tomography, comprising:
   (a) a high-frequency transmitter; and
   (b) a high-frequency receiver, said receiver including a local coil device and an external receiving antenna surrounding said local coil device and inductively coupled therewith,
   wherein said local coil device is electrically insulated from other components of said high-frequency receiver and comprises first and second antenna loops and an amplifier unit connected between said antenna loops.

2. The high-frequency apparatus of claim 1 wherein said two antenna loops are arranged substantially orthogonal to one another.

3. The high-frequency apparatus of claim 2 wherein each of said two antenna loops have different geometric extents.

4. The high-frequency apparatus of claim 2 wherein said external receiving antenna comprises a transmitting antenna of said high-frequency transmitter.

5. The high-frequency apparatus of claim 2 wherein said high-frequency transmitter includes a transmitting antenna independent of said external receiving antenna.

6. The high-frequency apparatus of claim 4 wherein said high-frequency transmitter and said high-frequency receiver have a same polarization type.

7. The high-frequency apparatus of claim 5 wherein said high-frequency transmitter and said high-frequency receiver have a same polarization type.

8. An apparatus for generating an image of a body, said apparatus comprising:
   (a) a high-frequency transmitter capable of exciting a nuclear spin in the body, said nuclear spin generating an original B-field component; and
   (b) a high-frequency receiver capable of detecting the original B-field component, said high-frequency receiver comprising an electrically-insulated local coil device to be disposed on the body and an external receiving antenna surrounding said local coil device and inductively coupled therewith, said local coil device including a first antenna loop, a second antenna loop, and an amplifier unit coupled between said first and second antenna loops, wherein said local coil device generates a new B-field component in response to the original B-field component, the new B-field component being substantially orthogonal to the original B-field component.

9. The apparatus of claim 8 wherein said first and second antenna loops are arranged substantially orthogonal to one another, said first antenna loop receiving the original B-field component and said second antenna loop generating the new B-field component.

10. The apparatus of claim 9 wherein said second antenna loop has a smaller geometric extent than said first antenna loop.

11. The apparatus of claim 10 wherein said external receiving antenna comprises a transmitting antenna for said high-frequency transmitter.

12. The apparatus of claim 10 wherein said high-frequency transmitter includes a transmitting antenna independent of said external receiving antenna.

13. The apparatus of claim 9 wherein said high-frequency receiver and said high-frequency transmitter have a same polarization type.

14. The apparatus of claim 8 wherein said first and second antenna loops jointly receive the original B-field component and jointly generate the new B-field component.

15. The apparatus of claim 14 wherein said external receiving antenna comprises a transmitting antenna for said high-frequency transmitter.

16. The apparatus of claim 14 wherein said high-frequency transmitter includes a transmitting antenna independent of said external receiving antenna.

17. The apparatus of claim 14 wherein said high-frequency receiver and said high-frequency transmitter have a same polarization type.

18. A local coil device for use in a nuclear spin tomography apparatus including a high-frequency transmitter for exciting nuclear spin in a body to be imaged and a high-frequency receiver for detecting a first B-field component generated by the nuclear spin, the high-frequency receiver including an external receiving antenna surrounding said local coil device, said local coil device comprising two antenna loops with an amplifier unit coupled between them, said local coil device capable of detecting the first B-field component and responsively generating a second B-field component to be detected by the external receiving antenna, the second B-field component being oriented substantially orthogonal to the first B-field component.

19. The local coil device of claim 18 wherein said two antenna loops are arranged substantially orthogonal to one another, one of said antenna loops receiving the first B-field component and the other of said antenna loops generating the second B-field component.

20. The local coil device of claim 18 wherein said two antenna loops jointly receive the first B-field component and jointly generate the second B-field component.

* * * * *